United States Patent
Tai et al.

(10) Patent No.: US 8,836,311 B2
(45) Date of Patent: Sep. 16, 2014

(54) POWER CONVERTER WITH SWITCHING CIRCUITS

(75) Inventors: Hiromichi Tai, Saitama (JP); Takeru Murao, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 12/757,491

(22) Filed: Apr. 9, 2010

(65) Prior Publication Data

US 2010/0219877 A1   Sep. 2, 2010

Related U.S. Application Data

(63) Continuation-in-part of application No. PCT/JP2008/003026, filed on Oct. 24, 2008.

(30) Foreign Application Priority Data

Oct. 24, 2007  (JP) ................................. 2007-276424

(51) Int. Cl.
| | |
|---|---|
| H02M 3/156 | (2006.01) |
| H03K 17/16 | (2006.01) |
| H02M 1/08 | (2006.01) |
| H03K 17/28 | (2006.01) |

(52) U.S. Cl.
CPC ............... H02M 1/08 (2013.01); H03K 17/168 (2013.01); H03K 17/28 (2013.01)
USPC ............ 323/289; 327/393; 327/401; 327/432

(58) Field of Classification Search
USPC ........... 323/289; 327/392, 393, 398, 400, 401
See application file for complete search history.

(56) References Cited

U.S. PATENT DOCUMENTS

| | | | | |
|---|---|---|---|---|
| 6,052,016 | A * | 4/2000 | Sugiura et al. ................ | 327/393 |
| 6,545,452 | B2 * | 4/2003 | Bruckmann et al. .......... | 323/289 |
| 6,906,574 | B2 * | 6/2005 | Ohi et al. ....................... | 327/392 |
| 2003/0095365 | A1 * | 5/2003 | Nakatake et al. ............ | 361/91.1 |
| 2004/0145406 | A1 * | 7/2004 | Tai ................................ | 327/432 |
| 2005/0017787 | A1 * | 1/2005 | Kojima ........................ | 327/432 |
| 2007/0187217 | A1 * | 8/2007 | Tai ................................ | 200/237 |
| 2008/0049473 | A1 * | 2/2008 | Sugahara et al. .............. | 363/89 |

FOREIGN PATENT DOCUMENTS

| | | |
|---|---|---|
| JP | 7-241080 | 9/1995 |
| JP | 2000-324799 | 11/2000 |
| JP | 2001-231247 | 8/2001 |
| JP | 2003-164139 | 6/2003 |
| JP | 2004-140891 | 5/2004 |
| JP | 2004-350404 | 12/2004 |
| JP | 2005-86940 | 3/2005 |

OTHER PUBLICATIONS

Merriam Webster Dictionary; http://www.merriam-webster.com/dictionary/between.*

* cited by examiner

*Primary Examiner* — Adolf Berhane
*Assistant Examiner* — Gustavo Rosario Benitez
(74) *Attorney, Agent, or Firm* — Oblon, Spivak, McClelland, Maier & Neustadt, L.L.P.

(57) ABSTRACT

Provided is a power converter having a switching circuit wherein a surge voltage of a plurality of switching elements connected in series is suppressed and loss is not concentrated to a specific switching element. The switching circuit is provided with: a non-latching type switching element having two main terminals and one control terminal; a voltage detecting means which detects a voltage applied between the main terminals of the switching element; a control current supply for supplying the control terminal with a control signal corresponding to the voltage detected by the voltage detector; and a delay device for delaying the control signal.

19 Claims, 11 Drawing Sheets

Conventional Technology

Conventional Technology

Conventional Technology

POWER CONVERTER WITH SWITCHING CIRCUITS

CROSS REFERENCES TO RELATED APPLICATIONS

This application is a continuation-in-part (CIP) application based upon the International Application PCT/JP2008/003026, the International Filing Date of which is Oct. 24, 2008, the entire content of which is incorporated herein by reference, and claims the benefit of priority from the prior Japanese Patent Application No. 2007-276424, filed in the Japanese Patent Office on Oct. 24, 2007, the entire content of which is incorporated herein by reference.

BACKGROUND OF THE INVENTION

This invention relates to an electric power converter which includes switching circuits having power switching elements such as an IGBT and a MOSFET.

As the switching elements have become larger in capacity and higher in speed, power converters using power switching elements have steadily expanded their range of applications. Among such power switching elements, MOS gate type switching elements including IGBTs and MOSFETs in particular have been increasing their field of applications lately.

Non-latching type switching elements such as IGBTs and MOSFETs have a significant advantage of high controllability with gate driving as compared to latching type switching elements such as a thyristor. Non-latching type switching elements can suppress a surge voltage or surge current according to gate control and can control the gradient of the current and voltage arbitrarily even in the period of switching transition at turn-on and turn-off.

One of the applications that make use of the characteristics of non-latching type switching elements is a multiple series high voltage conversion apparatus using an active gate driving technology. The multiple series high voltage conversion apparatus is a high voltage conversion apparatus in which a plurality of elements with stand voltages are connected in series for high voltage applications such as an electric power system. The multiple series conversion apparatus has the problem that slight differences in the switching timing between the plurality of elements connected in series can cause large variations in voltage distribution. A countermeasure against this is the active gate driving technology. This active gate driving technology described above is disclosed in, for example, the following reference: Japanese Patent Application Laid-Open Publication 2005-86940, the entire contents of which is incorporated herein by reference.

FIG. 7 shows an example of a conventional gate driving circuit that uses the active gate driving technology. More specifically, a switching element 9 in connection with a power line 21 has a control input terminal (or a gate terminal). The gate terminal is connected to a voltage amplifier 2 through a gate resistor 3 and the output terminal of a control current source 6. The input terminal of the control current source 6 is connected to the output terminal of a voltage amplifier 5. The collector-to-emitter voltage of the switching element 9, divided by voltage-dividing resistors 4a and 4b, is applied to the input terminal of the voltage amplifier 5.

With such a circuit configuration, in a normal operation state, the switching element 9 makes on/off operations according to the gate signal applied through the voltage amplifier 2. When a surge voltage is generated during the turn-off of the switching element 9, the output current from the control current source 6 increases. The current flowing into the gate terminal of the switching element 9 from the control current source 6 raises the gate voltage of the switching element 9, whereby the collector current of the switching element 9 is increased. As a result, the collector voltage of the switching element 9 drops. The surge voltage of the switching element 9 is suppressed by such an operation.

The foregoing active gate driving technology suppresses the occurrence of a surge voltage by the gate driving circuit making a feedback control on the main voltage Vice of the switching element. Such a system has the advantage of simple circuit configuration since no main circuit element is needed aside from the switching element. However, the system has a problem of increased switching loss, because the switching element bears all the loss. Hereinafter, such a problem will be described in detail with reference to FIG. 8.

When the active gate driving technology is used to suppress a peak surge voltage, extra loss occurs in a period when the surge voltage is suppressed for turn-off. This applies to the period II in FIG. 8. In the period II, the active gate driving circuit operates to clamp the constant collector voltage. The collector voltage during turn-off is proportional to dIc/dt, the time differential of the collector current. In the period II, dIc/dt or the gradient of the collector current has a constant value. Assuming a sufficiently small tail current, the loss E2 of the switching element in the period II is given by:

$$E2 = \frac{1}{2} Vcep \times Icp \times t2 \qquad [\text{Eq. 1}]$$

where Vcep is the collector-to-emitter voltage in the period II, t2 is the duration of the period II, and Icp is the maximum value of the collector current. In other words, the loss of the switching element in the period II is proportional to the duration of the period II.

Suppose that the active gate driving technology is applied to a power converter that includes a plurality of switching elements connected in series. In such a case, the same collector current flows through all the switching elements connected in series. Since the operation timing varies from one switching element to another, switching elements that turn off earlier bear a higher loss. This will be described with reference to FIG. 9.

In FIG. 9, it is assumed that a single arm constituting a power converter includes three switching elements connected in series. The switching elements have respective collector-to-emitter voltages Vce1, Vce2, and Vce3. The collector current Ic is common to all the elements connected in series. Suppose now that the switching element 1 has a shorter storage time than the other two switching elements 2 and 3, and starts to turn off earlier. In the period I of FIG. 9, the switching element 1 starts to turn off, with a rise in Vce1. The other switching elements 2 and 3 are yet to increase in voltage. Under the active gate control, the voltage Vce1 of the switching element 1 is clamped when a certain voltage Vcep determined by the active gate driving circuit is reached, and the period IIa starts. In the period IIa, the collector-to-emitter voltage Vce1 of the switching element 1 is clamped to Vcep. The other switching elements 2 and 3 start to turn off, whereas the collector current Ic does not significantly decrease yet because the arm voltage is still low. If the number of the switching elements connected in series is large and the voltage for each single switching element to bear is low as compared to the total arm voltage, the collector current Ic drops little in the period IIa. In the period IIb, the voltages of the other switching elements are also clamped to Vcep. The collector current Ic decreases significantly, and then reaches near zero, and the period IIb ends.

As described above, a switching element that starts to turn off earlier consume extra loss during the time t2a as compared to the other switching elements. In the example of FIG. 9, the maximum loss with respect to the switching elements that turn off later is given by:

$$E2a = Vcep \times Icp \times t2a \quad [\text{Eq. 2}]$$

The switching speed of a switching element is determined by variations in the switching element's own characteristics, and will not vary if the use conditions such as the gate resistance are constant. Therefore, the switching elements that have higher speeds among the plurality of switching elements connected in series are always the same. Consequently, when the active gate driving technology is applied to a power converter that has an arm including a plurality of switching elements connected in series, switching elements that switch earlier will inevitably consume a higher loss than the other switching elements.

SUMMARY OF THE INVENTION

The present invention has been made to solve the problem specified above. It is thus an object of the present invention to provide a power converter which includes a switching circuit that suppresses a surge voltage generated on a plurality of switching elements connected in series and prevents the concentration of loss on a certain switching element.

According to an aspect of the present invention, there is provided a power converter including a plurality of switching circuits connected in series, at least one of the switching circuits comprising: a non-latching type switching element that has two main terminals and a control terminal; a voltage detector that detects a voltage applied between the two main terminals of the switching element; a control current source that transmits a control signal into the control terminal according to the voltage detected by the voltage detector; and a delay device that delays transmitting the control signal for a predetermined delay time.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which.

DETAILED DESCRIPTION OF THE INVENTION

Figure 7:
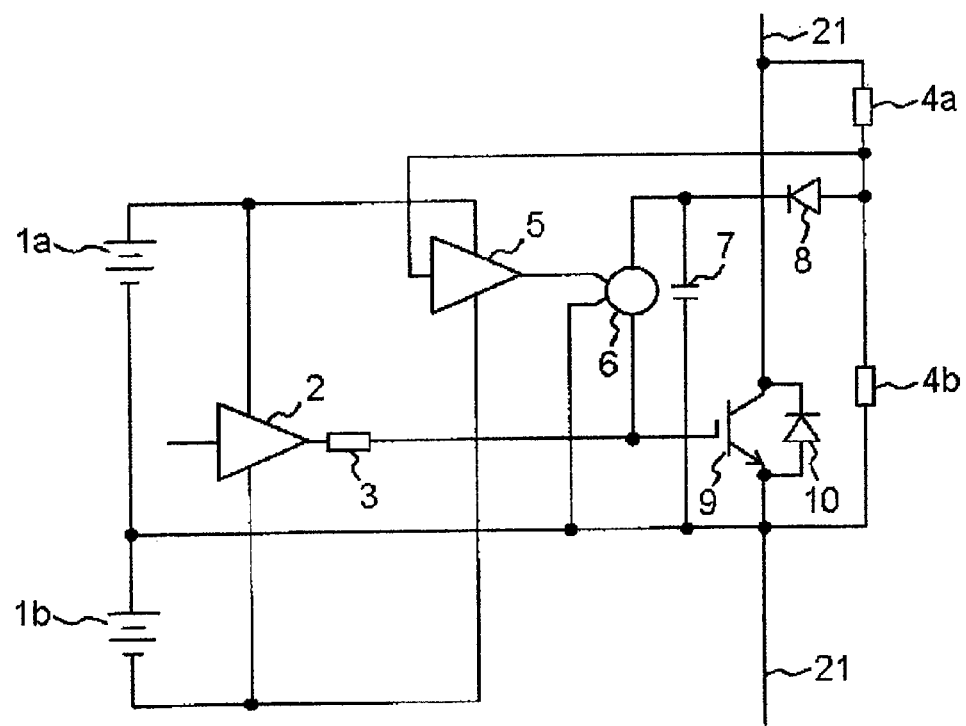
FIG. 7 is a diagram showing one of switching circuits in a conventional power converter.
Figure 8:
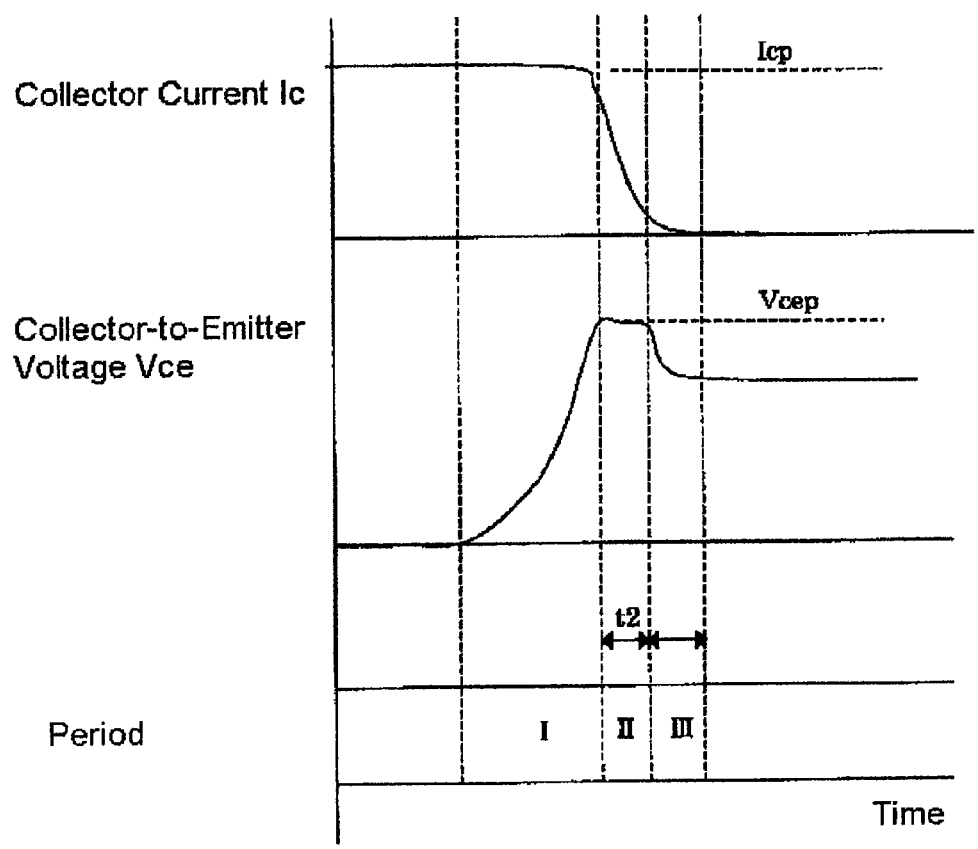
FIG. 8 is a waveform chart for explaining the switching loss in a switching circuit of the conventional power converter.
Figure 9:
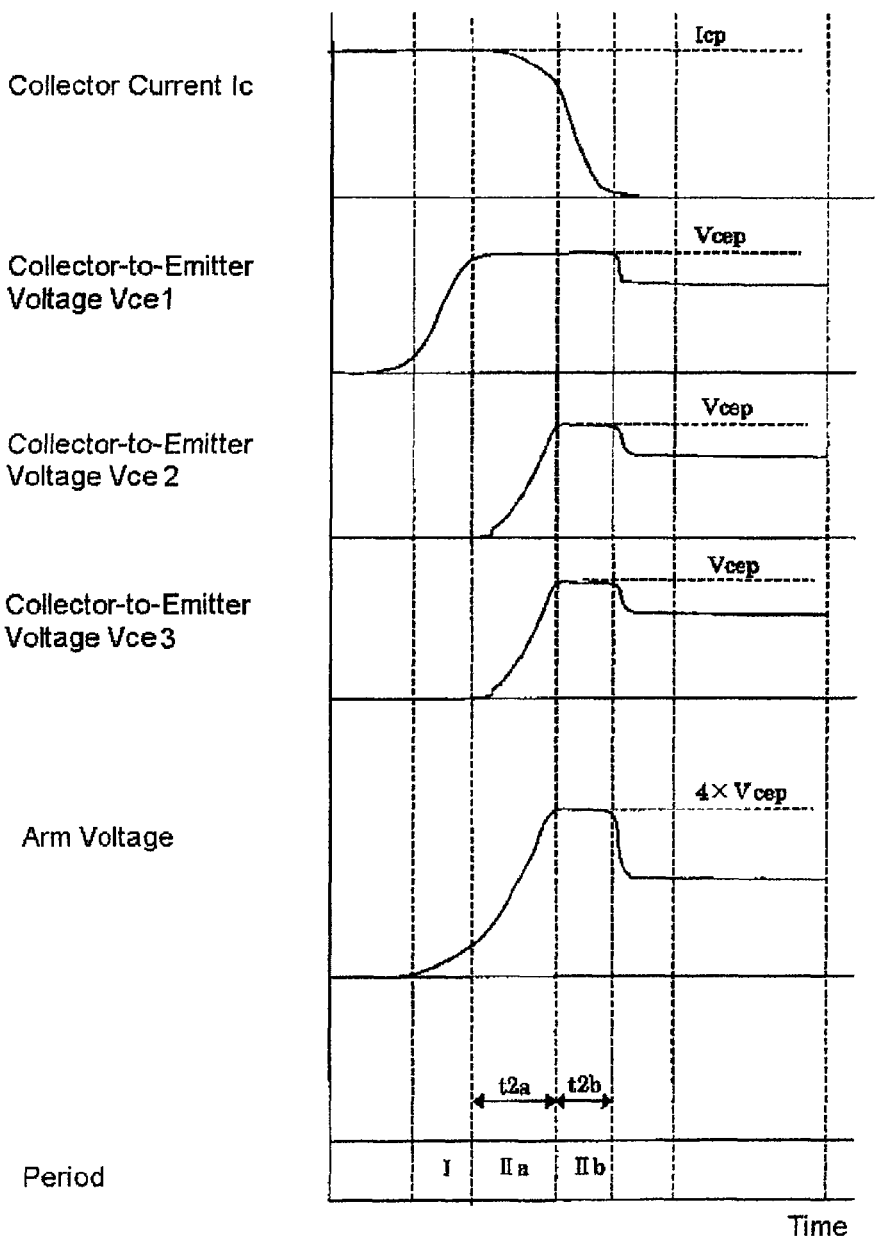
FIG. 9 is a waveform chart for explaining the distribution of the switching loss among the switching circuits of the conventional power converter.

Hereinafter, four embodiments of the present invention will be described with reference to FIGS. 1 to 6. In each of the embodiments, components identical or equivalent to those of FIG. 7 will be designated by the same reference symbols. Redundant descriptions will be omitted.

First Embodiment

Figure 1:
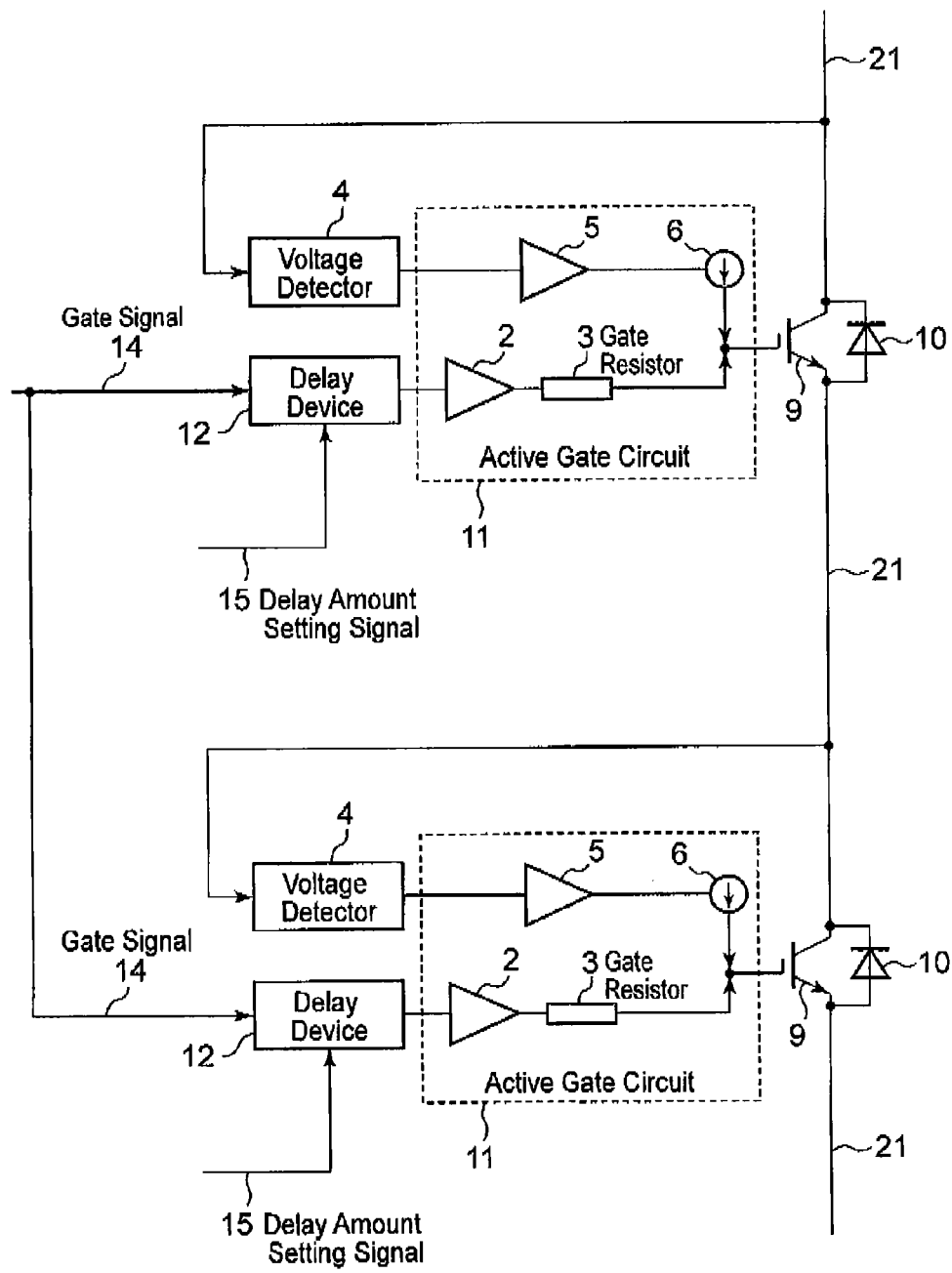
FIG. 1 is a diagram showing one of switching circuits in a power converter and the flow of signals according to a first embodiment of the present invention.

FIG. 1 is a diagram showing one of switching circuits in a power converter and the flow of signals according to a first embodiment of the present invention. The switching circuit of the present embodiment includes a power line 21, a switching element 9 and an active gate circuit 11. A power line 21 is connected to the emitter terminal and the collector terminal of the switching element 9. The active gate circuit 11 is connected to the gate terminal of the switching element 9. The active gate circuit 11 includes voltage amplifiers 2 and 5, a gate resistor 3, and a control current source 6. The switching circuit also includes a voltage detector 4 and a delay device 12. The voltage detector 4 detects the emitter-side voltage of the switching element 9 and transmits a signal to the voltage amplifier 5. The delay device 12 receives a gate signal 14 and a delay-amount setting signal 15 and transmits an output signal to the voltage amplifier 2. The switching element 9 is a voltage-controlled switching element of non-latching type such as an IGBT or a MOSFET. The power converter of the present embodiment includes an arm for DC-to-AC conversion. The arm has a plurality of the switching circuits of the same structure shown in FIG. 1 connected in series.

The operation of the switching circuit according to the present embodiment will be described below. The delay device 12 delays transmitting the gate signal 14 to the voltage amplifier 2 according to the delay-amount setting signal 15. The gate signal 14 is transmitted to all the switching elements in common from a control unit that is located in a low-potential section of the power converter. When a switching element has a smaller storage time, it takes a shorter time for the switching element to actually turn off after the gate signal 14 is switched off. As mentioned previously, such a switching element always bears a higher loss than the other elements. For the switching element of smaller storage time, the delay-amount setting signal 15 is thus set to be higher than that of the other switching elements in level so as to increase the delay amount (the amount of delay) of the delay device 12. This makes the turn-off timing coincident with those of the other switching elements so that the switching element bears the same amount of loss as the other switching elements do.

By the way, the operation delay of a switching element occurs mostly on the turn-off side. This phenomenon is particularly noticeable in switching elements that make a bipolar operation like an IGBT. For such switching elements, it is desired that variations of the operation delay are adjusted only on the turn-off side and are not adjusted on the turn-on side. The delay device 12 is then desirably configured so as to operate only on the turn-off side. Alternatively, different delay devices are desirably used on the turn-on side and on the turn-off side.

According to the present embodiment, the power converter having a plurality of switching elements connected in series can thus suppress a surge voltage generated on the switching elements and prevent the concentration of loss on a particular switching element.

Second Embodiment

Figure 2:
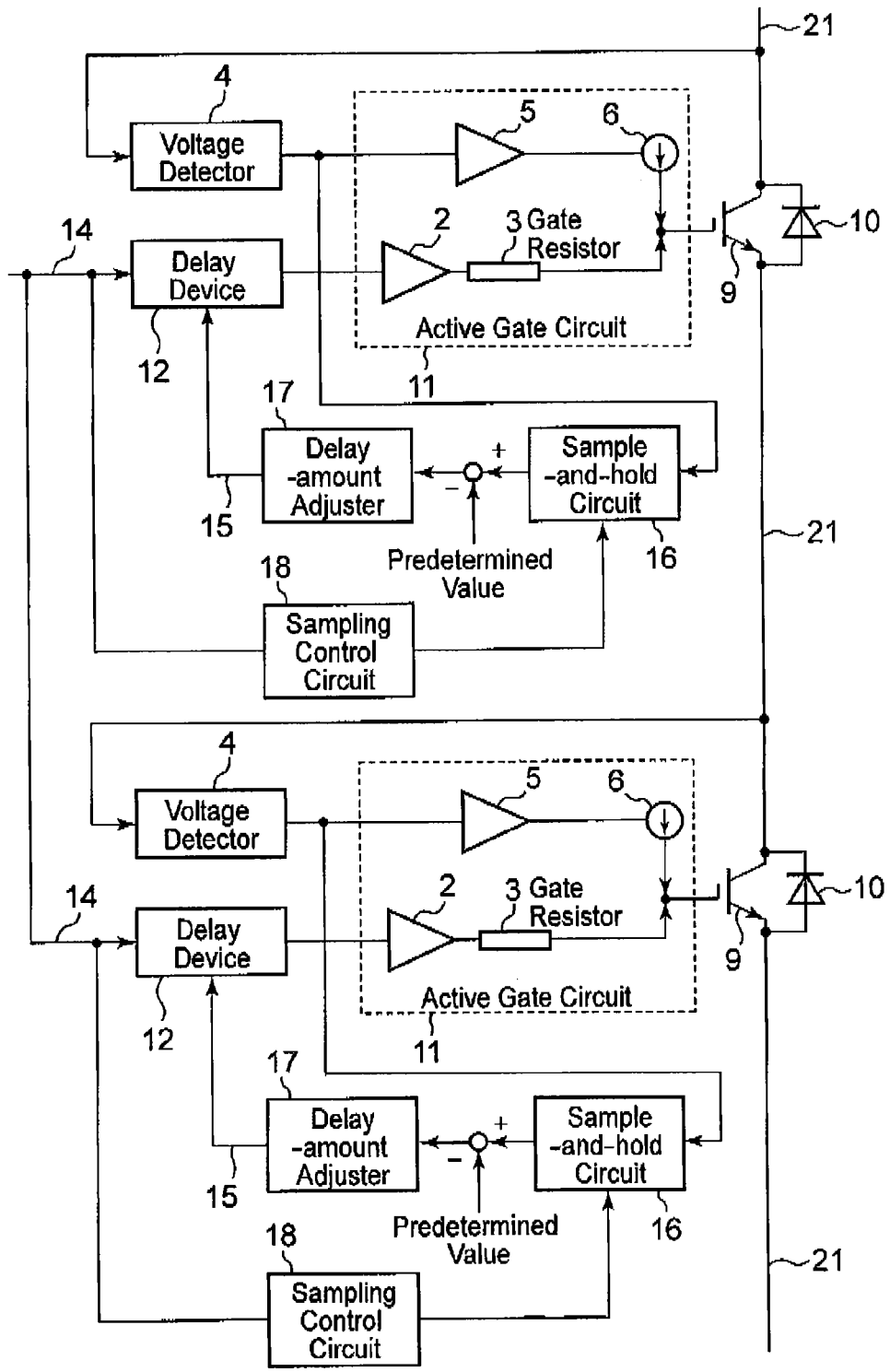
FIG. 2 is a diagram showing one of switching circuits in a power converter and the flow of signals according to a second embodiment of the present invention.

As a second embodiment, a method of setting the delay-amount setting signal 15 of the first embodiment will be described. Possible methods for setting the delay-amount setting signal 15 are broadly classified into two. One of the methods is to conduct an interruption test and the like in a factory before shipment, and set the amounts of delay so as to absorb differences in the operation delay attributable to differences between the storage times of the respective switching elements. The other is to detect differences in the operation delay between the switching elements during operation and dynamically adjust the amounts of delay. The present embodiment is of the latter method. More specifically, as shown in FIG. 2, the present embodiment includes a sample-and-hold circuit 16, a delay-amount adjuster 17, and a sampling control circuit 18 aside from the configuration shown in FIG. 1.

The output of the voltage detector 4 is transmitted to the sample-and-hold circuit 16. The delay-amount adjuster 17 transmits the delay-amount setting signal 15 that is adjusted according to the output of the sample-and-hold circuit 16. The delay device 12 accordingly delays transmitting the gate signal 14 for driving the switching element 9. The sample-and-hold circuit 16 is controlled by the sampling control circuit 18. The sample-and-hold circuit 16 performs a sampling operation in time with the reset of the held output and turn-off timing over a period as long as or longer than a single cycle of the output current of the power converter based on the gate signal 14.

Figure 3:
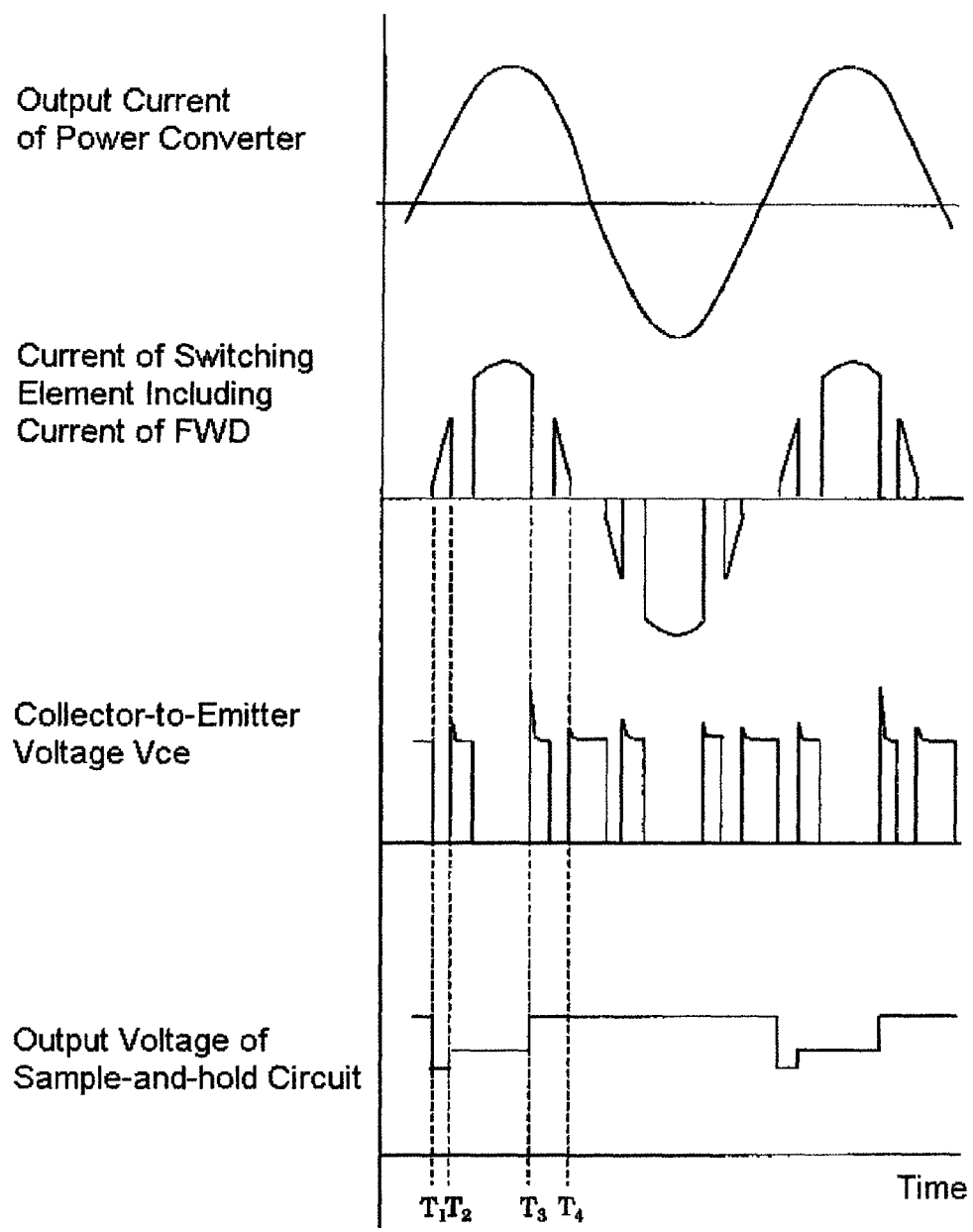
FIG. 3 is a waveform chart for explaining the operation of the power converter according to the second embodiment of the present invention.

Power converters often use a sinusoidal modulation PWM (Pulse Width Modulation) method. FIG. 3 shows the voltage and current waveforms of various parts of such a power converter. The output current of the power converter is a near sinusoidal wave. The current of the switching element 9 including the current of a flywheel diode (FWD) 10 which is connected in parallel has the shape of the output current notched by PWM switching. In a static view, the collector-to-emitter voltage Vce of the switching element 9 is the same as the power supply voltage. The surge voltage immediately after turn-off, however, generally tends to increase with the current that flows through the switching element 9. As shown in FIG. 3, the peak value of the collector-to-emitter voltage Vce varies within a single cycle of the output current of the power converter.

What the switching circuit and the power converter should deal with is the switching timing at which the loss peaks. Such switching timing refers to when the switching element 9 interrupts the highest current in a single cycle. As shown in FIG. 3, the collector-to-emitter voltage is detected by the voltage detector 4, and is sampled in synchronization with the turn-off timing of the gate signal 14 by the sample-and-hold circuit 16. The sampled value by the sample-and-hold circuit 16 is compared with the hold value outputted at the point in time. If the sampled value exceeds the hold value, the hold output is adjusted to the sampled value. Such a sample-and-hold operation is performed for a single cycle, so that the output of the sample-and-hold circuit 16 has a value equivalent to the maximum value of the collector-to-emitter voltage Vce.

With the configuration of FIG. 2, the delay amount of the gate signal 14 by the delay device 12 is adjusted so as to suppress the maximum value of the collector-to-emitter voltage in a period as long as or longer than a single cycle period of the power converter. That is, the operation compensates the delay of the switching element 9 with the delay device 12.

Third Embodiment

Figure 4:
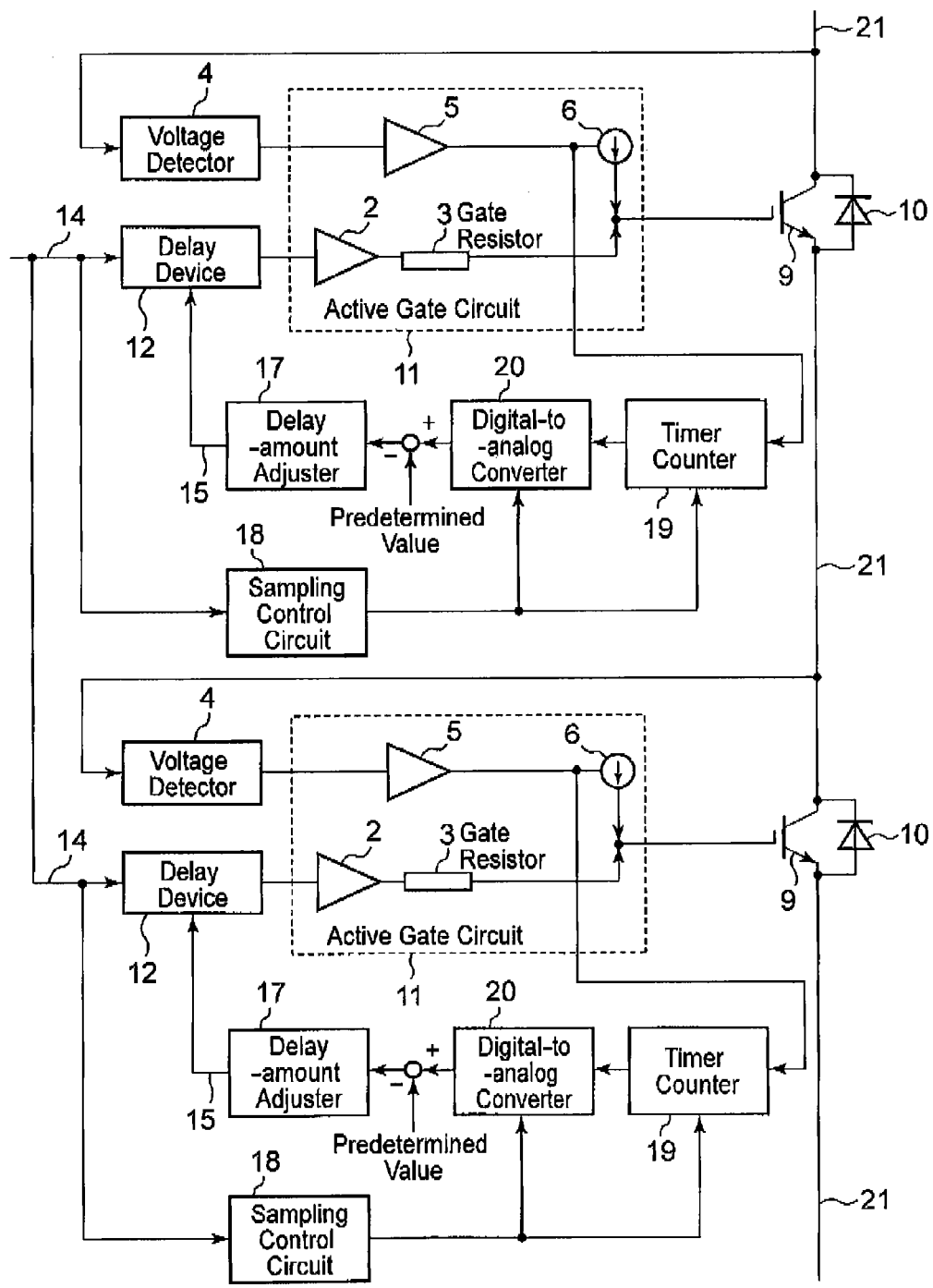
FIG. 4 is a diagram showing one of switching circuits in a power converter and the flow of signals according to a third embodiment of the present invention.
Figure 5:
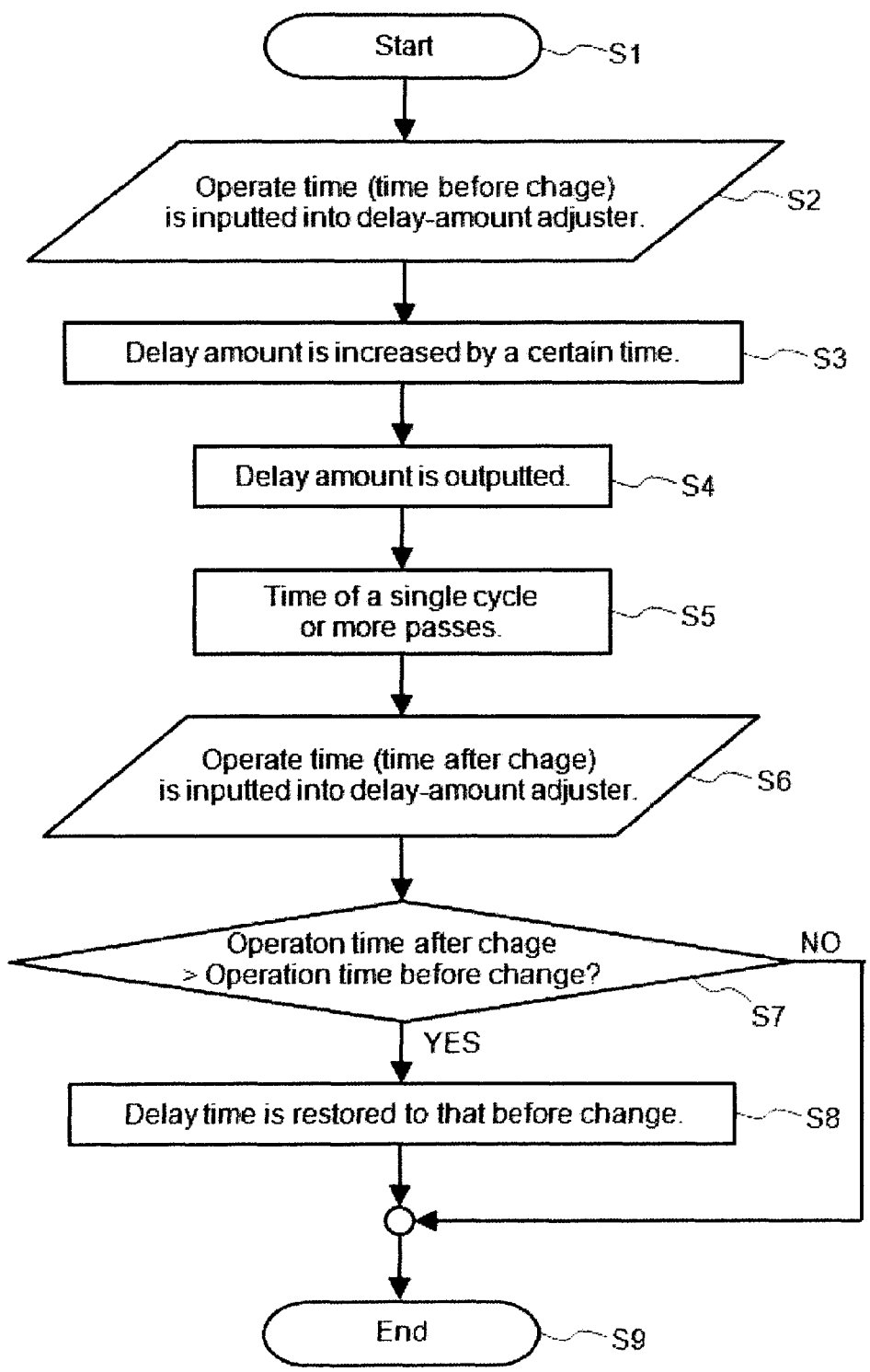
FIG. 5 is a flowchart for explaining the operation of a power converter according to a fourth embodiment of the present invention.
Figure 6:
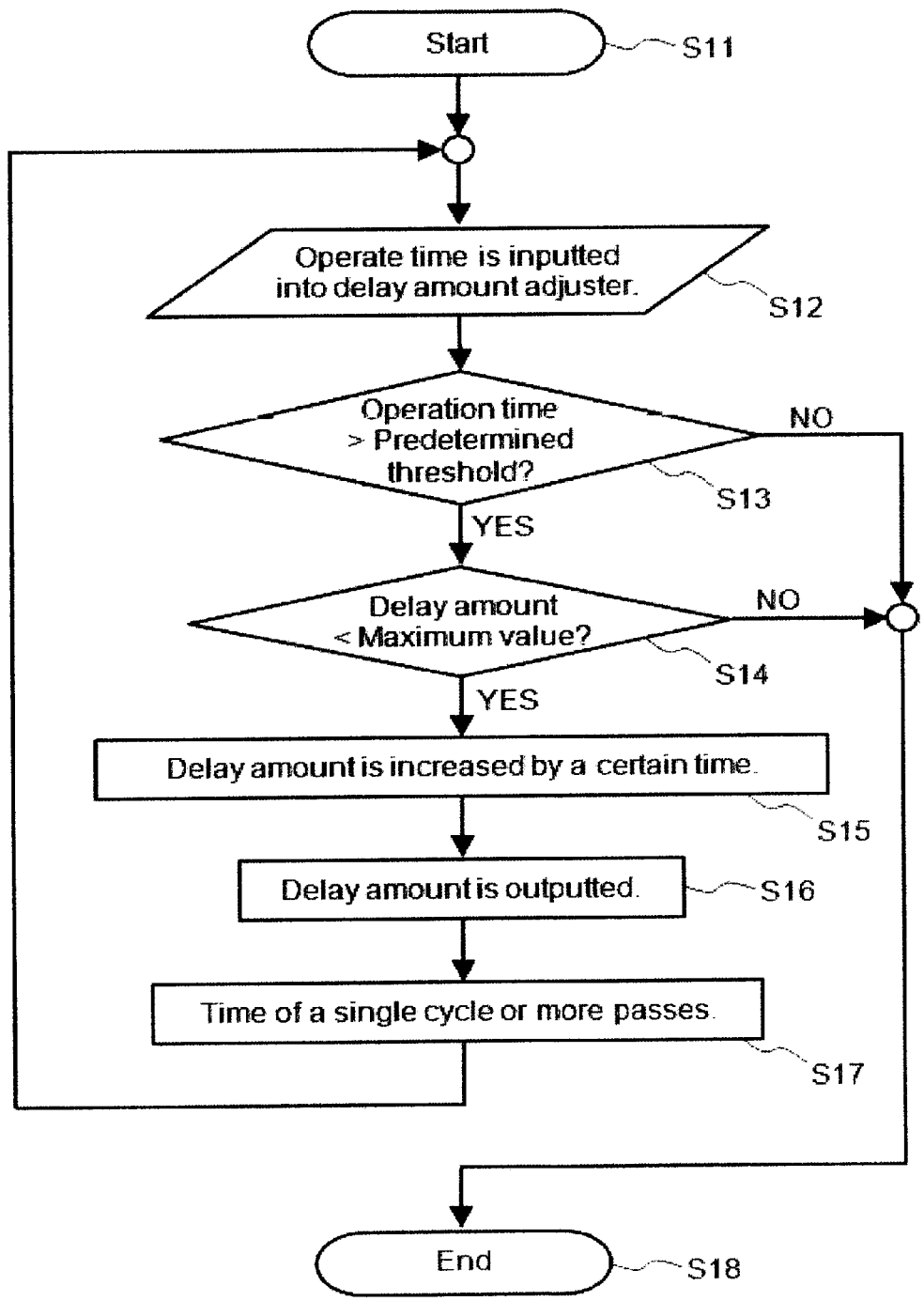
FIG. 6 is a flowchart for explaining the operation of a power converter according to a fifth embodiment of the present invention.

In the foregoing second embodiment, the delay amount is adjusted according to the collector-to-emitter voltage Vce of the switching element 9. In an operating region where the peak value of the collector-to-emitter voltage Vce is clamped by the active gate driving, however, it is difficult to evaluate the effect of the operation delay of the switching element 9 by the foregoing method. The reason is that the maximum value of the peak voltage of the collector-to-emitter voltage Vce will be clamped if the switching element 9 has a switching delay smaller than a certain level. The present embodiment deals with such a case. As shown in FIG. 4, the switching circuit of the present embodiment includes a timer counter 19 and a digital-to-analog (DA) converter 20 instead of the sample-and-hold circuit 16 of the second embodiment (FIG. 2).

In the switching circuit of the present embodiment, the timer counter 19 monitors the input signal to the control current source 6, and counts the time span of operation of the active gate circuit 11. The DA converter 20 converts the count output into an analog signal. The delay-amount adjuster 17 converts the analog signal into the delay-amount setting signal 15, which determines the delay amount of the delay device 12. The sampling control circuit 18 controls the operation of the timer counter 19 and the DA converter 20 based on the gate signal 14.

When the voltage of the switching element 9 exceeds a certain value, the active gate circuit 11 operates. The delay amount is set according to the operating time. Consequently, when the switching operation of the switching element 9 is faster than that of other elements, the delay amount is increased to suppress the difference in the operating time from the other elements so as to suppress an increase in loss.

Figure 10:
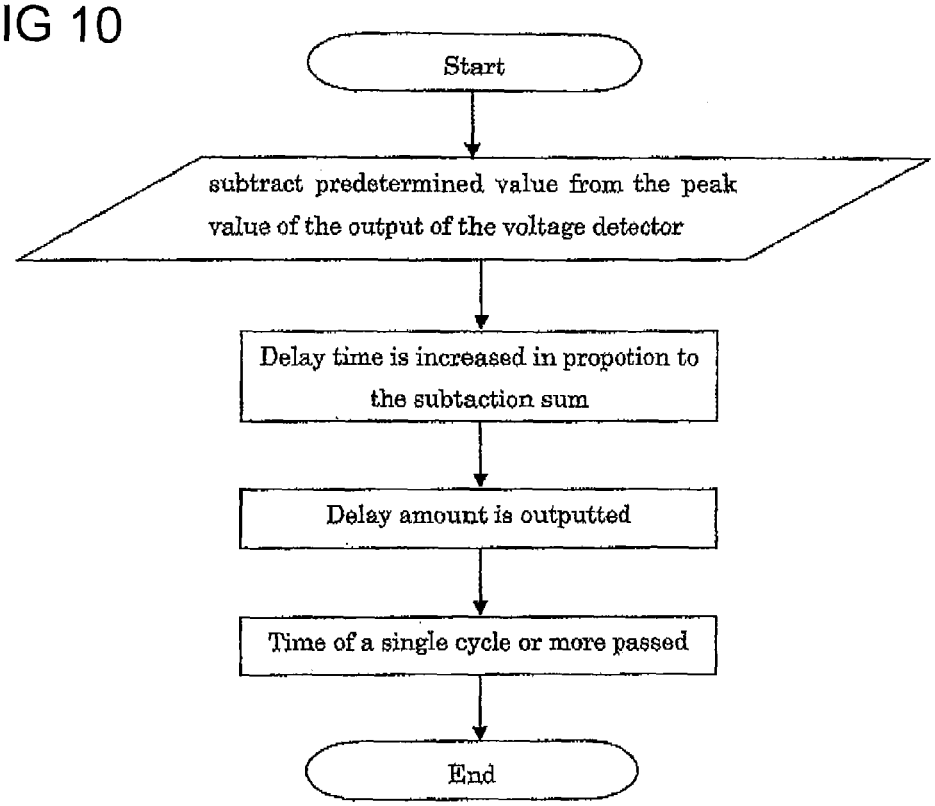
FIG. 10 is a flowchart for explaining a value that is determined by subtracting a predetermined value from the peak value of the output of the voltage detector in the operation of a power converter according to a third embodiment of the present invention.
Figure 11:
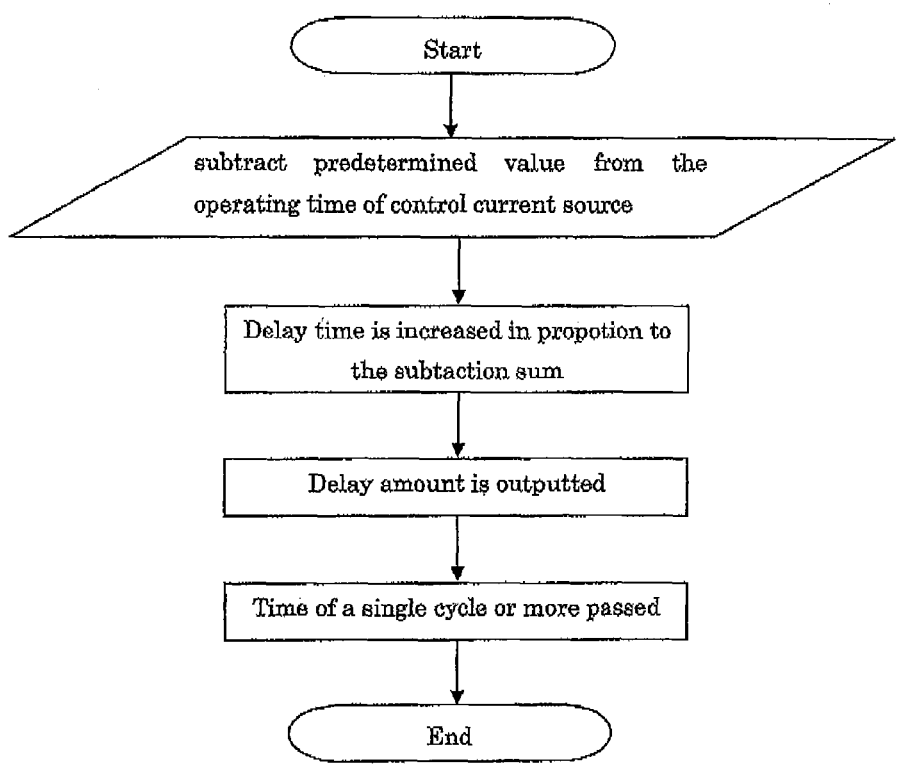
FIG. 11 is a flowchart for explaining a value that is determined by subtracting a predetermined value from the operating time of the control current source in the operation of a power converter according to a third embodiment of the present invention.

Note that in the present embodiment, the delay amount may be increased in proportion to a value that is determined by subtracting a predetermined value from the peak value of the output of the voltage detector 4 (FIGS. 2 and 10), or a value that is determined by subtracting a predetermined value from the operating time of the control current source 6 (FIGS. 4 and 11).

If, for example, the input signal to the control current source 6 is erroneously recognized, an extremely large delay amount may be set to cause a large element loss. To avoid this, a limiting means may be provided to limit the setting value of the delay amount within an allowable range.

Fourth Embodiment

In addition to the configuration of the foregoing second and third embodiments (FIGS. 2 and 4), the present embodiment includes a comparing means for comparing the operating time of the control current source 6 between before and after the setting of the delay amount is changed. The comparing means can restore the setting before the change if the delay amount increased by a certain time makes the operating time too long. The operation of the comparing means will be described with reference to the flowchart of FIG. 5.

Initially, the operating time (operating time before a change) of the active gate circuit 11 is inputted to the delay-amount adjuster 17 (step S2). The delay amount increased by a certain time (the delay amount after a change) is outputted (steps S3 and S4). After a lapse of time of a single cycle or more (step S5), the operating time (operating time after the change) of the active gate circuit 11 is inputted to the delay-amount adjuster 17 again (step S6). Here, the operating time before the change and the operating time after the change are compared with each other (step S7). If the operating time after the change is longer than the operating time before the change, the delay amount is restored to that before the change (step S8). If the operating time after the change is shorter than or equal to the operating time before the change, the delay amount after the change is maintained.

In a modification, the comparing means may compare the peak value of the output of the voltage detector 4 between before and after the change of the setting (step 7).

Fifth Embodiment

The present embodiment deals with the delay-amount adjuster 17 according to the foregoing second or third embodiments (FIGS. 2, 4). The loss-based temperature increase of the switching element is dominated by the thermal time constant of the switching element. The thermal time constant is from several hundreds of milliseconds to several seconds, far longer than electric operations. In view of this, the delay-amount adjuster 17 can make a simple integral operation of long time constant. The operation of the delay-amount adjuster 17 may otherwise be performed digitally. Such a digital operation will be described with reference to the flowchart of FIG. 6.

Initially, the operating time of the active gate circuit 11 is input to the delay-amount adjuster 17 (step S12). The operating time is compared with a predetermined threshold (step S13). If the threshold is exceeded and the delay amount is below a maximum value (step S14), the delay amount is increased by a certain time (step S15) and the resulting delay amount is output (step S16). After a lapse of time of a single cycle or more (step S17), the operating time of the active gate circuit 11 is input to the delay-amount adjuster 17 again (step S12). Consequently, if the active gate circuit 11 is operating for more than a certain duration, the delay amount is cyclically increased. The delay amount is then stabilized when the operating time of the active gate circuit 11 falls to or below the threshold.

What is claimed is:

1. A power converter including a plurality of switching circuits connected in series, each of the switching circuits comprising:
    a non-latching type switching element that has two main terminals and a control terminal;
    a voltage detector that detects a voltage of an emitter of the non-latching type switching element;
    a first voltage amplifier that amplifies the voltage of the emitter detected by the voltage detector;
    a control current source that transmits a control signal into the control terminal according to an output of the first voltage amplifier;
    a delay device that delays a turn-off timing of transmitting the control signal for a predetermined delay time to synchronize one of the switching circuits with another switching circuit connected in series;
    a second voltage amplifier that amplifies an output of the delay device;
    a gate resistor connected to an output side of the second voltage amplifier, wherein the control terminal is connected to an output side of the control current source and is connected to the gate resistor on a side opposite to that of the second voltage amplifier, the plurality of switching circuits include: a first switching circuit having a first non-latching type switching element of a first storage time, and a second switching circuit having a second non-latching type switch element of a second storage time that is longer than the first storage time, and
    for the first non-latching type switching element, a delay-amount setting signal is set higher than that of the second non-latching type switching element to increase the delay amount of its delay device to make the turn-off timing of the first non-latching type switching element coincident with a turn-off timing of the second non-latching type switching element, so that the first non-latching type switching element has a same amount of loss as the second non-latching type switching element.

2. The power converter according to claim 1, wherein the delay time is set based on a peak value of an output of the voltage detector in a period of at least one cycle of operation of the power converter.

3. The power converter according to claim 2, wherein the delay time is increased in proportion to a value that is determined by subtracting a predetermined value from the peak value of the output of the voltage detector.

4. The power converter according to claim 3, further comprising:
    comparing means for comparing the peak values of the outputs of the voltage detector before and after a time when the delay time setting is changed.

5. The power converter according to claim 3, further comprising:
    limiting means for limiting a maximum value of the setting of the delay time.

6. The power converter according to claim 3, further comprising:
    a sample-and-hold circuit to which the output of the voltage detector is input;
    a sampling control circuit that controls the sample-and-hold circuit; and
    a delay-amount adjuster that outputs the delay-amount setting signal to the delay device, the delay-amount setting signal being adjusted according to an output of the sample-and-hold circuit.

7. The power converter according to claim 2, wherein the delay time is increased by a unit time if the peak value of the output of the voltage detector exceeds a predetermined value.

8. The power converter according to claim 7, further comprising:
    comparing means for comparing the peak values of the outputs of the voltage detector before and after a time when the delay time setting is changed.

9. The power converter according to claim 7, further comprising:
    limiting means for limiting a maximum value of the setting of the delay time.

10. The power converter according to claim 7, further comprising:
- a sample-and-hold circuit to which the output of the voltage detector is input;
- a sampling control circuit that controls the sample-and-hold circuit; and
- a delay-amount adjuster that outputs the delay-amount setting signal to the delay device, the delay-amount setting signal being adjusted according to an output of the sample-and-hold circuit.

11. The power converter according to claim 1, wherein the delay time is set based on an operating time of the control current source in a period of at least one cycle of operation of the power converter.

12. The power converter according to claim 11, wherein the delay time is increased in proportion to a value that is determined by subtracting a predetermined value from the operating time of the control current source.

13. The power converter according to claim 12, further comprising:
- comparing means for comparing the operating time of the control current source before and after a time when the delay time setting is changed.

14. The power converter according to claim 12, further comprising:
- limiting means for limiting a maximum value of the setting of the delay time.

15. The power converter according to claim 12, further comprising:
- a timer counter that monitors an input signal to the control current source to count the operating time span of the control current source;
- a digital-to-analog converter that converts an output of the timer counter into an analog signal;
- a sampling control circuit that controls the timer counter and the digital-to-analog converter; and
- a delay-amount adjuster that outputs the delay-amount setting signal to the delay device, the delay-amount setting signal being adjusted according to an output of the digital-to-analog converter.

16. The power converter according to claim 11, wherein the delay time is increased by a unit time if the operating time of the control current source exceeds a predetermined value.

17. The power converter according to claim 16, further comprising:
- comparing means for comparing the operating time of the control current source before and after a time when the delay time setting is changed.

18. The power converter according to claim 16, further comprising:
- limiting means for limiting a maximum value of the setting of the delay time.

19. The power converter according to claim 16, further comprising:
- a timer counter that monitors an input signal to the control current source to count the operating time of the control current source;
- a digital-to-analog converter that converts an output of the timer counter into an analog signal;
- a sampling control circuit that controls the timer counter and the digital-to-analog converter; and
- a delay-amount adjuster that outputs the delay-amount setting signal to the delay device, the delay-amount setting signal being adjusted according to an output of the digital-to-analog converter.

* * * * *